United States Patent
Danielson et al.

(10) Patent No.: US 6,426,176 B1
(45) Date of Patent: Jul. 30, 2002

(54) METHOD OF FORMING A PROTECTIVE CONDUCTIVE STRUCTURE ON AN INTEGRATED CIRCUIT PACKAGE INTERCONNECTION

(75) Inventors: Donald D. Danielson, Forrest Grove; Stanford Miller, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/226,992

(22) Filed: Jan. 6, 1999

(51) Int. Cl.[7] .............................. G03F 7/00; H01L 21/44
(52) U.S. Cl. ...................... 430/315; 430/311; 430/313; 430/318; 430/324; 438/613
(58) Field of Search ................................. 430/311, 313, 430/315, 318, 324; 438/613

(56) References Cited

FOREIGN PATENT DOCUMENTS

| JP | 56-164557 | * 12/1981 |
|---|---|---|
| JP | 4-280434 | * 10/1992 |
| JP | 5-74778 | * 3/1993 |
| JP | 9-232319 | * 9/1997 |

OTHER PUBLICATIONS

English Translation of JP 5–74778, Kaneshiro, Yoshio, "Bump and Forming Method Thereof", Mar. 1992.*

English Translation of JP 9–232319, Mizutani, Hiroshi, "Manufacturing Method of Solder Bump", Sep. 1997.*

* cited by examiner

Primary Examiner—Mark F. Huff
Assistant Examiner—Nicole Barreca
(74) Attorney, Agent, or Firm—Blakely, Sokoloff, Taylor & Zafman LLP

(57) ABSTRACT

The invention provides a method of forming a conductive structure on an integrated circuit substrate. A metal bump, of a first material, is structured on the substrate so that the metal bump electrically contacts a metal part on the substrate. A protective layer is formed on the metal bump. The first material has a first conductivity. The protective layer is of a second material which has a second conductivity which is more than the first conductivity.

13 Claims, 4 Drawing Sheets

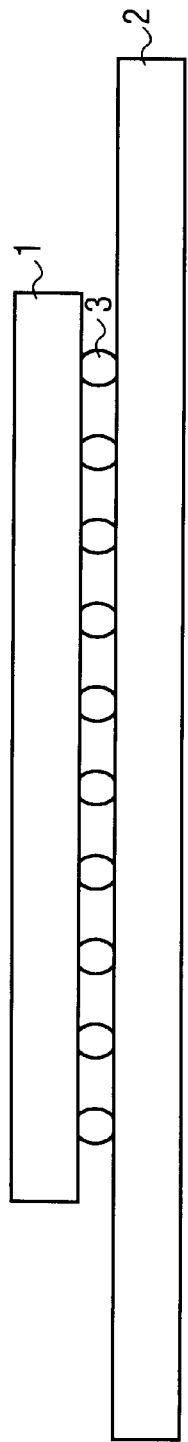
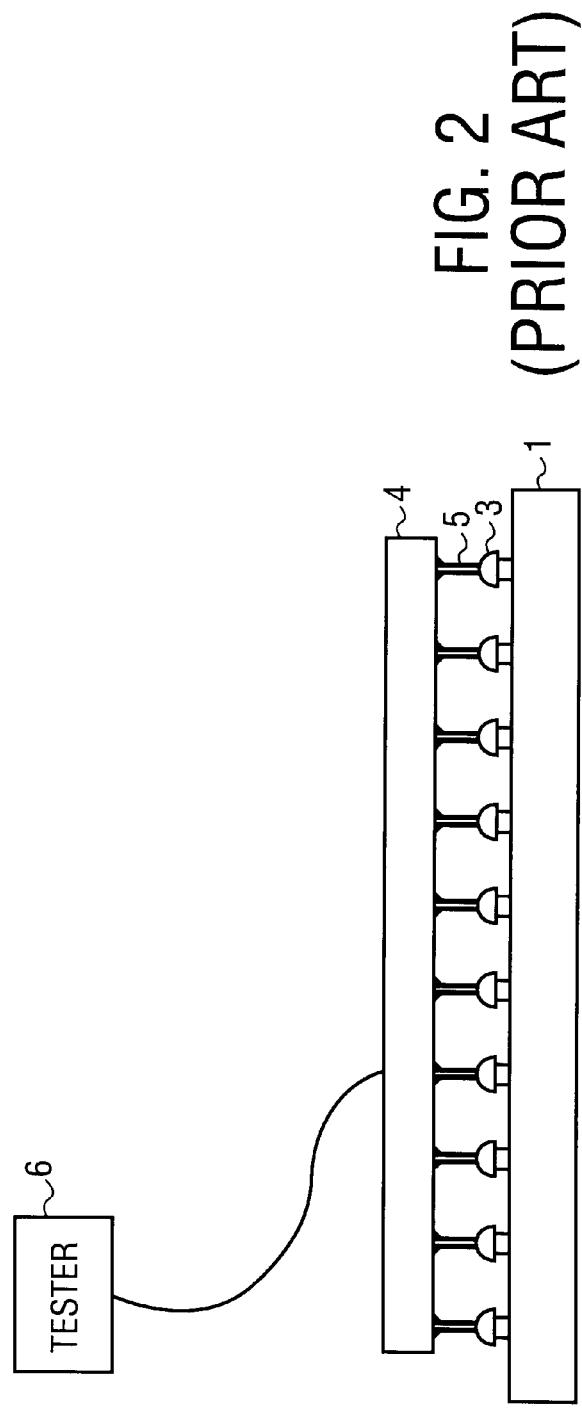

METHOD OF FORMING A PROTECTIVE CONDUCTIVE STRUCTURE ON AN INTEGRATED CIRCUIT PACKAGE INTERCONNECTION

BACKGROUND OF THE INVENTION

1). Field of the Invention

The present invention relates to a method of forming a protective conductive structure on an integrated circuit package interconnection. More specifically, the present invention relates to such a conductive structure which is plated for low resistivity and corrosion protection reasons.

2). Discussion of Related Art

The manufacture of a semiconductor chip involves the formation of an integrated circuit on a wafer. Bond pads are formed on the wafer and are connected to the integrated circuit. Conductive structures such as controlled collapse chip connect (C4) bumps are then formed on the wafer so that each bump is electrically connected to a respective bond pad. The wafer is then cut into a number of semiconductor dice. Such a die is then mounted to a package substrate with the bumps located between the die and the package substrate. FIG. 1 shows such a die 1 which is cut from a wafer and mounted to a substrate 2 by an array of C4 bumps 3.

An integrated circuit within the wafer is usually tested for logic functionality and speed before being cut into respective dice.

One method of testing an integrated circuit within a wafer is shown in FIG. 2. A probe card 4 is brought into contact with the wafer 1. The probe card 4 has a number of contacts 5, each making contact with a respective unreflowed bump 3 on the wafer 1. The probe card 4 is connected to an electrical tester 6. The electrical tester 6 is then operated to test the integrated circuit with an interface between the contacts 5 and the bumps 3 providing a link between the electrical tester and the integrated circuit.

The bumps 3 are often made primarily of lead. These lead bumps are prone to corrosion, especially during thermal shock or elevated temperature tests of the wafer 1. Corrosion of the lead bumps results in a layer comprising of lead oxides and contaminants on the lead bumps having relatively low conductivities and leading to a relatively high contact resistance between the contacts 5 of the probe card 4 and lead bumps 3. A high contact resistance may result in the electrical tester not accurately testing the speed or functionality of the integrated circuit.

SUMMARY OF THE INVENTION

The invention provides a method of forming a conductive structure on an integrated circuit substrate. A metal bump, of a first material, is structured on the substrate so that the metal bump electrically contacts a metal part on the substrate. A protective layer is formed on the metal bump. The first material has a first conductivity. The protective layer is of a second material which has a second conductivity which is more than the first conductivity.

BRIEF DESCRIPTION OF THE DRAWINGS

The invention is further described by way of examples with reference to the accompanying drawings wherein:

FIG. 1 is a side view showing a prior art semiconductor package;

FIG. 2 is a view showing diagrammatically how an integrated circuit in a wafer can be tested;

DESCRIPTION OF THE INVENTION

A method of forming a conductive structure on an integrated circuit substrate, and resulting structure are described. In the following description, for purposes of explanation, numerous specific details are set forth in order to provide a thorough understanding of the present invention. It will be evident, however, to one skilled in the art, that the present invention may be practiced without these specific details.

This invention relates to a method of forming conductive structure on an integrated circuit substrate such as a semiconductor die or wafer. For the most part the conductive structure is formed according to a process which is known as the controlled collapse chip connect (C4) process. A conductive metal layer is deposited on the substrate. A photoresist layer is then deposited on the conductive metal layer. The photoresist layer is then patterned to define openings above bond pads on the substrate. A lead containing bump is then formed within each opening. The bump fills the opening and partially overlies the photoresist layer. The bump is formed utilizing an electroplating technique. A tin protective layer is then formed on the bump. The photoresist layer may be removed before or after forming the tin protective layer. In the case where the photoresist layer is removed after the tin protective layer is formed, the conductive metal layer may then be partially removed to leave a metal portion below each bump. The protective layer reduces the contact resistance between the bump and a probe card which is brought into contact with the conductive structure.

FIGS. 3a to 3h illustrate one method of forming a conductive structure on an integrated circuit substrate.

Figure 3A:
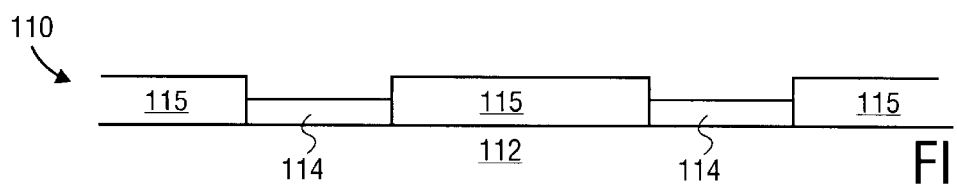
FIG. 3a is a sectioned side view of a structure comprising an integrated circuit substrate having bond pads on a surface of the substrate.

FIG. 3a of the accompanying drawings illustrates a structure 110 comprising an integrated circuit substrate 112 having contact pads 114 located on a surface thereof. The bond pads 114 are separated by portions of a polyimide passivation layer 115. The integrated circuit substrate is typically a semiconductor chip or a semiconductor wafer having an integrated circuit (not shown) formed below a surface thereof with the bond pads 114 within electric communication with the integrated circuit.

The integrated circuit may at this stage be tested by means of an electrical device which utilizes a probe card for making contact with the bond pads 114.

Metal bumps have to be formed on each of the bond pads. The metal bumps are used for connecting the substrate electrically to another device such as a package substrate, a computer motherboard or a computer card. The integrated circuit may again have to be tested after the metal bumps are formed.

Figure 3B:
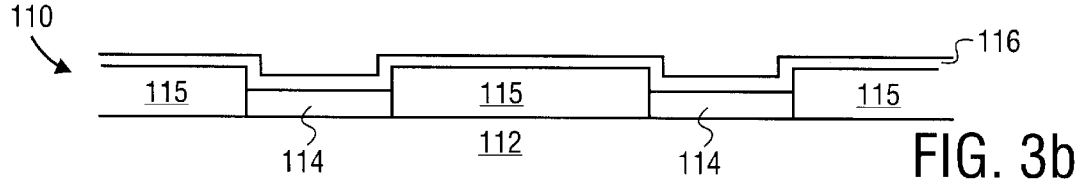
FIG. 3b is a view similar to FIG. 3a wherein a metal layer is formed over the substrate and the bond pads.

FIG. 3b shows the structure 110 of FIG. 3a after a metal layer 116 is formed over the substrate 112 and over the bond pads 114. The metal layer 116 is typically made of a conductive transition metal alloy for instance containing nickel and is formed in a blanket deposition process.

Figure 3C:
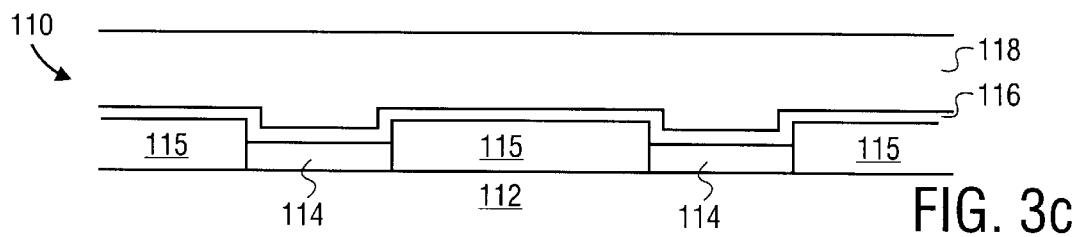
FIG. 3c is a view similar to FIG. 3b wherein a photoresist layer is formed on the metal layer.

FIG. 3c shows the structure 110 of FIG. 3b after a photoresist layer 118 is formed on the metal layer 116. The photoresist layer 118 is deposited to a thickness which is less than the height of the required metal bumps previously referred to.

Figure 3D:
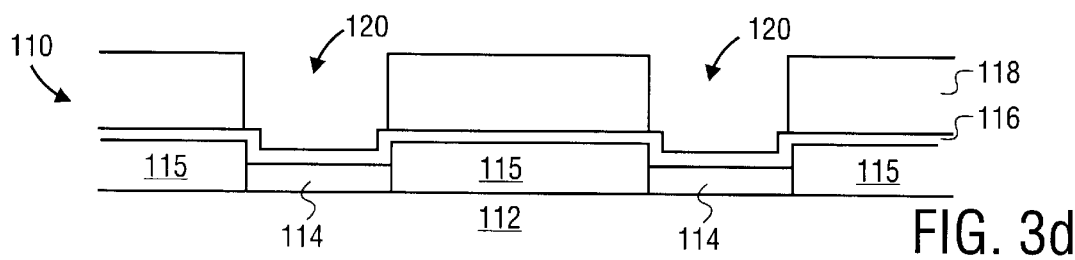
FIG. 3d is a view similar to FIG. 3c wherein the photoresist layer is patterned.

FIG. 3d shows the structure 110 of FIG. 3c after the photoresist layer 118 is patterned. The photoresist layer 118 is patterned to define an opening 120 above each bond pad 114. Each opening 120 extends down to the metal layer.

Figure 3E:
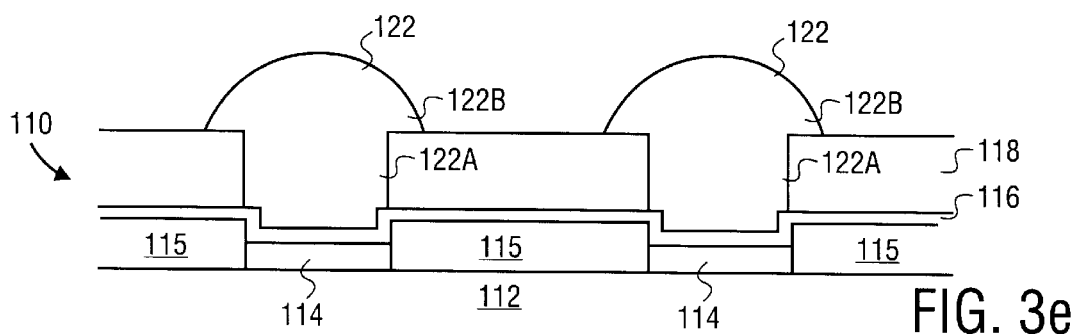
FIG. 3e is a view similar to FIG. 3d after the formation of a metal bump over each bond pad.

FIG. 3e shows the structure of FIG. 3d after the formation of a metal bump 122 above each bond pad 114. The metal bump 122 is formed by a plating technique. One plating technique that may be used for forming the metal bump 122 is electroplating wherein a voltage is applied to the metal layer 116. The metal bump 122 starts forming on the metal layer 116 within the opening 120. Once the opening 120 is filled, the metal of the metal bump continues forming until partially overlaying the photoresist layer. The final metal bump 122 then has a shape having a thin stem 122A and a larger head 122B on the stem 122A.

The metal bump 122 is typically made of a first material which, when corroded, forms an oxides, sulfides and carbonates having a first conductivity. Such a material may include lead. Lead has a conductivity of 0.0046 $(\mu cm)^{-1}$. In one example the first material contains a mixture of lead and tin. The first material typically includes at least 90% lead. A conductivity of an oxide of lead ($PbO_x$) may be as low as $10^{-15}$ $(\mu cm)^{-1}$ depending on oxide composition.

Figure 3F:
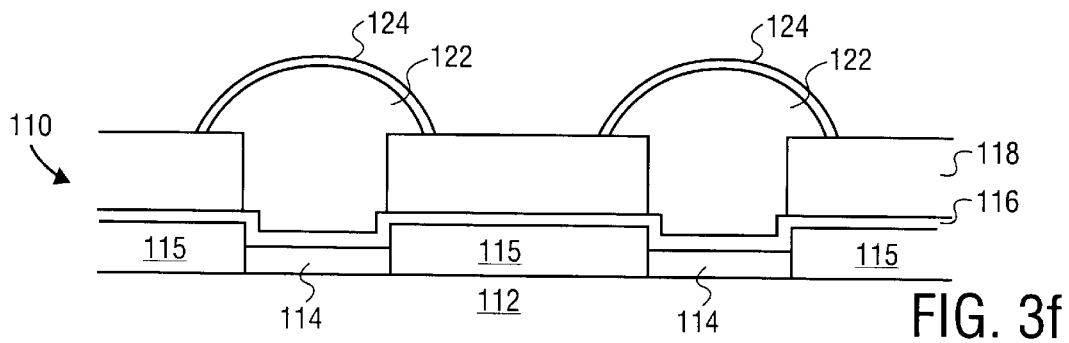
FIG. 3f is a view similar to FIG. 3e wherein a protective layer is formed on each bump.

FIG. 3f shows the structure 110 of FIG. 3e after the formation of a protective layer 124 on each metal bump 122. The protective layer 124 is made of a second material, which, when oxidized, forms an oxide having a second conductivity which is higher than the first conductivity. The protective layer 124 is typically made of at least 90% tin and preferably comprises substantially pure tin. The protective layer 124 is typically in the range of between about 20Å and about 500Å thick, and preferably is between about 50Å and about 200Å thick. Tin has a conductivity of about 0.088 $(\mu cm)^{-1}$. The conductivity of an oxide of tin such as $SnO_2$ is about $2.5 \times 10^{-5}$ $(cm)^{-1}$.

Other materials which may be used for the protective layer include copper, silver and gold, although silver and gold may be too expensive for commercial purposes. Copper has a conductivity of about $5.8 \times 10^{-1}$ $(\mu cm)^{-1}$, copper oxide a conductivity of about $10^{-8}$ to $10^{-9}$ $(\mu cm)^{-1}$, silver a conductivity of about $6.3 \times 10^{-1}$ $(\mu cm)^{-1}$, and gold about $4.1 \times 10)^{-1}$ $(\mu cm)^{-1}$.

In one example the metal bump 122 is made of lead and the protective layer 124 is made of tin. The tin protective layer 124 is formed on the metal bump 122 utilizing a selective electroless plating technique. The tin protective layer 124 applies selectively only on the lead metal bump 122 and not on the photoresist layer 118. Tin, in a solution such as diluted tin metal sulfonate used for plating the tin protective layer 124, oxidizes the lead in the metal bump 122, thereby ionizing some of the lead. The ionized lead goes into solution and the tin, being reduced, replaces the lead.

Figure 3G:
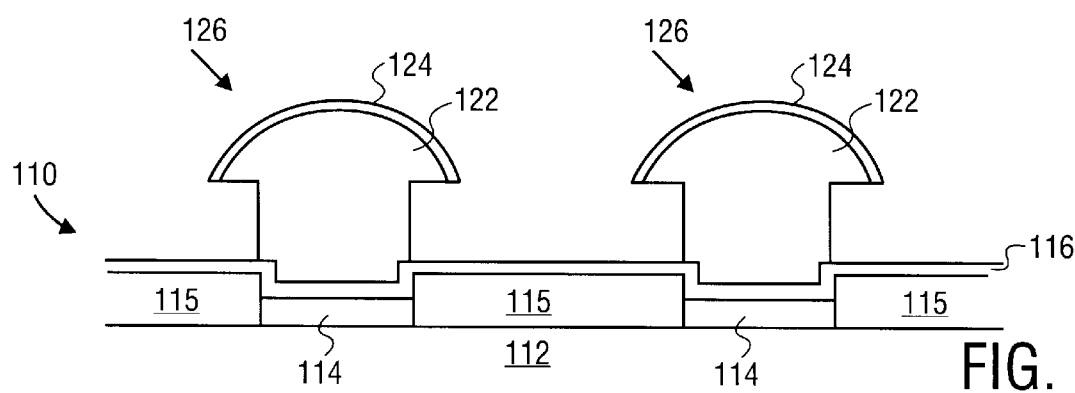
FIG. 3g is of view similar to FIG. 3f wherein the photoresist layer removed.

FIG. 3g illustrates the structure 110 of FIG. 3f after the photoresist layer 118 is removed. After removal of the photoresist layer 118 a free standing conductive structure 126 with a plated cap remains over each bond pad 114.

Figure 3H:
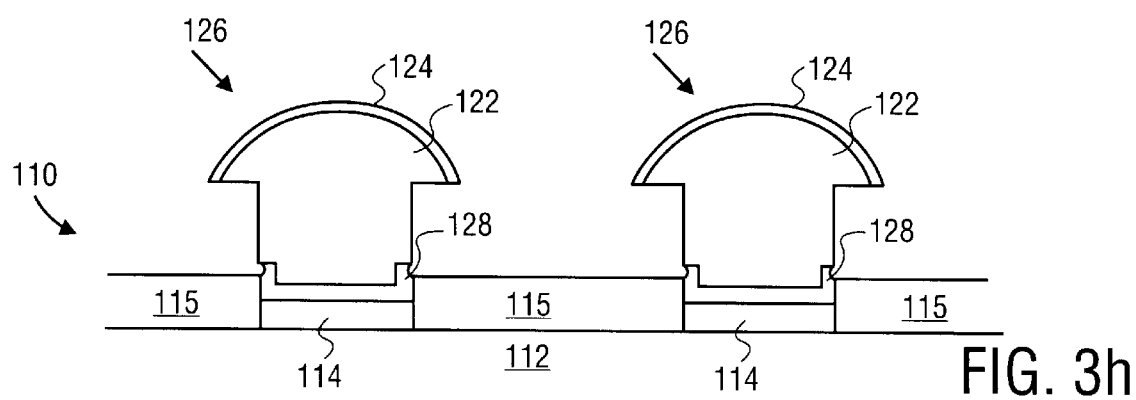
FIG. 3h is of view similar to FIG. 3g wherein the metal layer is partially removed.

FIG. 3h shows the structure 110 of FIG. 3g after the metal layer 116 is partially removed to finalize the manufacture of an electronics device. Patterning of the metal layer 116 is done by means of an etchant which removes the material of the metal layer 116 selectively over the materials of the conductive structure 126. After the metal layer is partially removed a metal portion 128 remains between each conductive structure 126 and a respective bond pad 114.

In one example the metal portion 128 contains nickel or another transition metal, the metal bump 122 is made of lead, and the protective layer 124 is made of tin.

The integrated circuit, referred to, is usually tested after formation of the conductive structures 126. A probe card is brought into contact with the conductive structures. The probe card is connected to an electrical tester. Testing of the integrated circuit is then carried out with contacts of the probe card making contact with the conductive structures 126. Since the protective layer 124 is relatively conductive when compared to an oxide of the metal bump 122 or the material of the metal bump itself, the probe card makes proper electrical contact with the conductive structures 126. Furthermore, since the protective layer 124 forms an oxide which is relatively conductive when compared to an oxide of the metal bump 122, proper electrical contact is ensured even after the protective layer 124 has oxidized. When lead is used as a metal bump and no protective layer is applied, a resistance between the metal bump and the probe card may be between 100 and 1,000 times as much as when tin is used as a protective layer. The reduction in contact resistance is aided in that tin, when oxidizing forms a tin oxide, which is electrically conductive. By so reducing contact resistance between the conductive structure and the probe card a more accurate verification of the integrity of the integrated circuit can be obtained. Fewer dice or wafers with good integrity integrated circuits manufactured therein may then be scrapped.

Figure 4A:
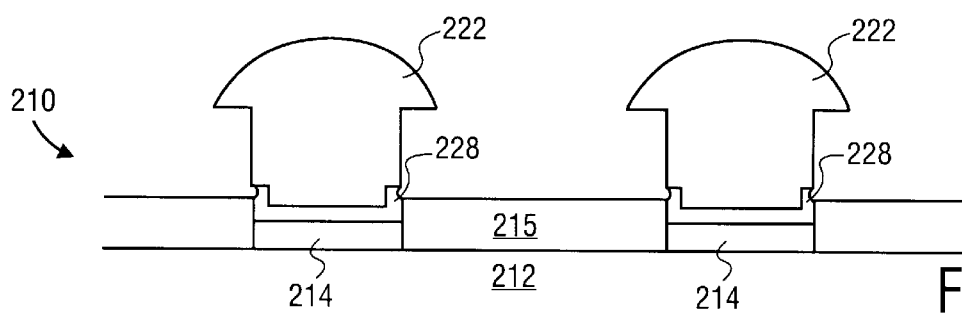
FIG. 4a is a sectioned side view of a structure formed according to a conventional C4 process.
Figure 4B:
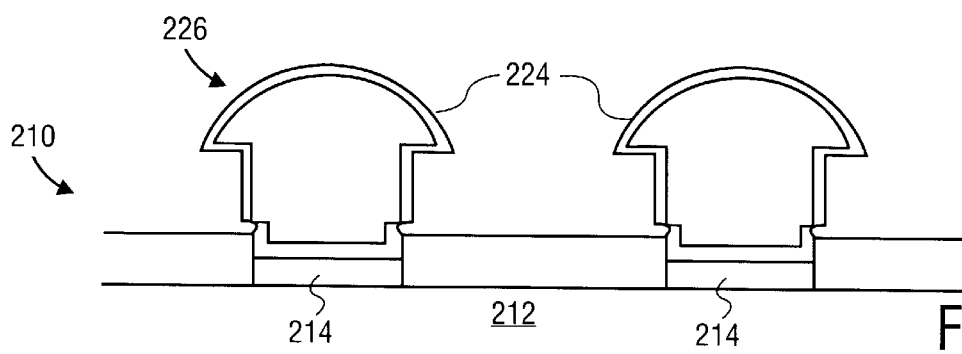
FIG. 4b is of view similar to FIG. 4a wherein a protective layer is formed on each metal bump.

FIGS. 4a–4b illustrate another method of forming a conductive structure on an integrated circuit substrate.

In FIG. 4a a structure 210 is formed according to a conventional C4 process. The structure 210 is similar to the structure 110 shown in FIG. 3h except that no protective layer is formed. The structure 210 therefore includes an electronics substrate 212 having bond pads 214 separated by portions of a passivation layer 215, a metal portion 228 on each bond pad 214, and a metal bump 222 on each metal portion 228. The materials of the structure 210 may be the same as the materials of the structure 110 of FIG. 3h.

FIG. 4b shows the structure 210 of FIG. 4b after the formation of a protective layer 224 over each metal bump 222. The protective layer 224 may be made of the same material and in a similar process as the protective layer 124, as discussed with reference to FIG. 3f.

One advantage of the structure 210 of FIG. 4b over the structure 110 of FIG. 3h is that the protective layer 224 covers a larger area and extends further down towards the substrate. The electrical path between the relatively conductive protective layer 224 and the bond pad 214 is so shortened, thus making the final structure a better conductor.

In one example the metal bump 222 is made of lead, the protective 224 is made of tin, and the metal layer 228 contains a transition metal such as nickel. The tin protective layer 224 applies selectively only on the lead metal bump 222 and not on the passivation layer 215. Tin in a solution used for plating the tin protective layer 224 oxidizes with the lead in the metal bump 222, thereby ionizing some of the lead. The ionized lead goes into solution and the tin, being reduced, replaces the lead.

The structure 210 of FIG. 4b therefore has a number of free standing conductive structures 226 on the metal layer 228. Each conductive structure 226 has a core and a protective plating on all surfaces of the core.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A method of forming a conductive structure on an integrated circuit substrate comprising:

forming a photoresist layer over the substrate;

patterning the photoresist layer to define an opening extending to a metal part on the substrate;

plating a metal bump of a first material on the substrate so that the metal bump electrically contacts the metal part on the substrate, the metal bump having a stem in the opening in the photoresist layer and a head on the stem and over the photoresist layer;

removing the photoresist layer to expose the stem; and plating a protective layer on the metal bump, the protective layer forming on the head and on the exposed stem, the protective layer being of a second material, wherein the first material has a first conductivity and the second material has a second conductivity which is higher than the first conductivity.

2. The method of claim 1 wherein the second material, when oxidized, forms an oxide having a conductivity which is higher than an oxide of the first material.

3. The method of claim 1 wherein the first material includes lead.

4. The method of claim 3 wherein the first material includes at least 95% lead.

5. The method of claim 1 wherein the second material includes tin.

6. The method of 5 wherein the second material includes at least 95% tin.

7. The method of claim 5 wherein the second material is substantially pure tin.

8. The method of claim 1 further comprising first forming a metal layer on the substrate, the metal bump then being plated on the metal layer.

9. The method of claim 8 further comprising etching the metal layer to form a conductive portion between the metal bump and the substrate.

10. The method of claim 8 wherein the metal bump is formed on the metal layer utilizing an electroplating technique with a voltage applied to the metal layer.

11. The method of claim 1 wherein the protective layer is formed utilizing a selective electroless plating technique.

12. A method of forming a conductive structure on an integrated circuit substrate comprising:

forming a photoresist layer over the substrate;

patterning the photoresist layer to define an opening extending to a metal part on the substrate;

plating a lead containing bump on the substrate so that the bump electrically contacts a metal part on the substrate, the metal bump having a stem in the opening in the photoresist layer and a head on the stem and over the photoresist layer;

removing the photoresist layer to expose the stem; and plating a tin protective layer on the bump, the protective layer forming on the head and on the exposed stem.

13. The method of claim 12 wherein the protective layer is plated onto the bump utilizing a selective electroless plating technique.

* * * * *